United States Patent [19]
Deas

[11] Patent Number: 6,065,090
[45] Date of Patent: May 16, 2000

[54] MEMORY MANAGEMENT APPARATUS THAT REPLACES DEFECTIVE STORAGE LOCATIONS WITH FUNCTIONAL STORAGE LOCATIONS

[75] Inventor: Alexander R. Deas, Edinburgh, United Kingdom

[73] Assignee: Memory Corporation PLC, Edinburgh, United Kingdom

[21] Appl. No.: 08/944,824

[22] Filed: Oct. 6, 1997

Related U.S. Application Data

[63] Continuation of application No. PCT/GB96/00320, Feb. 14, 1996.

[30] Foreign Application Priority Data

Apr. 4, 1995 [GB] United Kingdom .................. 9506908

[51] Int. Cl.$^7$ .................................................. G06F 11/20
[52] U.S. Cl. .................. 711/1; 711/5; 711/202; 711/101; 711/170; 714/40; 714/41; 714/42
[58] Field of Search .................. 711/1, 5, 202, 711/101, 170, 173, 196; 365/200, 201; 395/183.17; 714/40, 41, 42

[56] References Cited

U.S. PATENT DOCUMENTS

| | | | |
|---|---|---|---|
| 4,319,343 | 3/1982 | Powell | 365/196 |
| 4,937,790 | 6/1990 | Sasaki et al. | 365/230.01 |
| 5,255,228 | 10/1993 | Hatta | 365/200 |
| 5,299,164 | 3/1994 | Takeuchi | 365/201 |
| 5,337,318 | 8/1994 | Tsukakoshi | 714/704 |
| 5,377,146 | 12/1994 | Reddy et al. | 365/200 |
| 5,386,386 | 1/1995 | Ogihara | 365/200 |
| 5,517,450 | 5/1996 | Ohsawa | 365/200 |

FOREIGN PATENT DOCUMENTS

| | | |
|---|---|---|
| 411 626 | 2/1991 | European Pat. Off. . |
| 442 319 | 8/1991 | European Pat. Off. . |
| 472 209 | 2/1992 | European Pat. Off. . |
| 94/22085 | 9/1994 | WIPO . |

OTHER PUBLICATIONS

EP, A, 0 442 319 (Texas Instrument Inc) 21 Gallia et al, Whole Document, Aug. 21, 1991.
EP, A, 0 472,209 (Toshiton Micro-Electronics Corp) whole doc., Feb. 26, 1992.

*Primary Examiner*—Eddie P. Chan
*Assistant Examiner*—Than V. Nguyen
*Attorney, Agent, or Firm*—Pillsbury Madison & Sutro LLP

[57] ABSTRACT

A device for replacing defective storage locations with working storage locations comprises receiving means for receiving an incoming address for accessing a storage location, comparing means for comparing the incoming address with all of the addresses of known defective storage locations, and directing means for directing accesses to an alternative location when the incoming address matches one of the addresses of known defective storage locations. There is one alternative storage location and one comparing means for each known defective storage location. In this invention only a portion of the incoming address is used in the comparing means. In addition, each of the comparing means may use a different portion of the address for accessing a storage location.

4 Claims, 2 Drawing Sheets ial Appln. No. PCT/GB96/00320 filed Feb. 14, 1996 which designated the U.S.

MEMORY MANAGEMENT APPARATUS THAT REPLACES DEFECTIVE STORAGE LOCATIONS WITH FUNCTIONAL STORAGE LOCATIONS

This is a continuation of International Appln. No. PCT/GB96/00320 filed Feb. 14, 1996 which designated the U.S.

BACKGROUND OF THE INVENTION

The invention relates to memory devices, and, in particular, to memory management of devices for computer systems and the like. It finds particular application in memory systems that use partially working memory circuits where defective rows, columns, bits or bytes in the main memory circuit are replaced by good rows, columns, bits or bytes from a supplementary store (usually called a substitute store). These memory systems may include the controlling means to disable a defective area when it is being accessed and enable a replacement area. This controlling means is referred to as a partial memory engine.

In the semiconductor industry, solid state memory devices are fabricated as dice on wafers of silicon, each die containing a memory array. These die are tested and those which can be made to work perfectly are packaged for use. The other die, those which contain one or more defective memory cells, are usually either discarded or used in some fault tolerant memory device.

SUMMARY OF THE INVENTION

Our co-pending international patent application PCT/GB94/00577 relates to the control of memory systems using a partial memory engine. We have now devised a more flexible arrangement for replacing bits, bytes, rows or columns in which some of the circuitry can be configured in a number of different ways.

BRIEF DESCRIPTION OF THE SEVERAL VIEWS OF THE DRAWINGS

The invention will now be particularly described, by way of example, with reference to the accompanying drawings, in which.

DETAILED DESCRIPTION OF THE INVENTION

Figure 1:
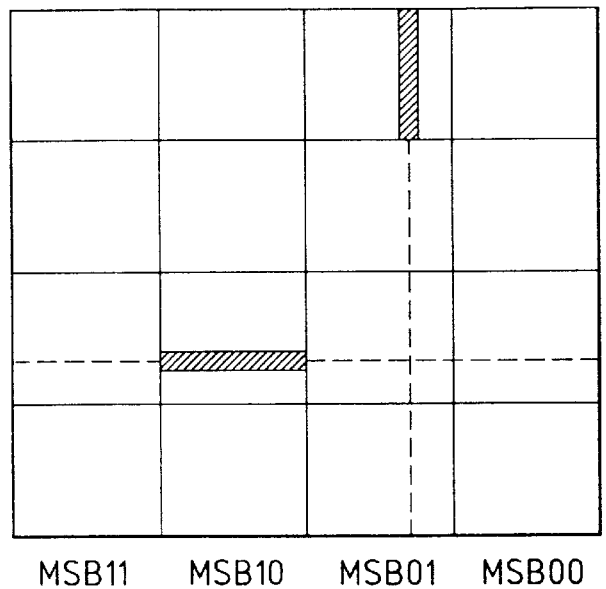
FIG. 1 shows a diagram of blocks in a RAM (random access memory) chip which has faults in part of the rows and columns.

Some memory circuits, for example DRAMs (Dynamic Random Access Memories) are composed of a number of planes (typically four, eight, or sixteen), with each plane containing a number of blocks of memory cells. FIG. 1 illustrates the case where one plane is composed of sixteen Blocks. In this type of arrangement all four rows in a block usually share the same row address and all four columns in a block usually share the same column address. It is common in memory circuits to have block failures within a row or a column. Thus it would be desirable to be able to detect when a defective block within a row or column is being accessed and to substitute a block for that block.

In FIG. 1 the four columns are labelled MSB 11, MSB 10, MSB 01, and MSB 00. The reason for this type of labelling is that rows in the blocks are usually selected by the most significant bits of the column address. Where there are four columns of blocks then the two most significant bits are used, where there are eight columns of blocks then the three most significant bits are used (since $2^3=8$), and so on. In the example of FIG. 1, the two most significant bits from the column address are required to locate the block of columns and the full row address is required to locate the defective row.

Figure 2:
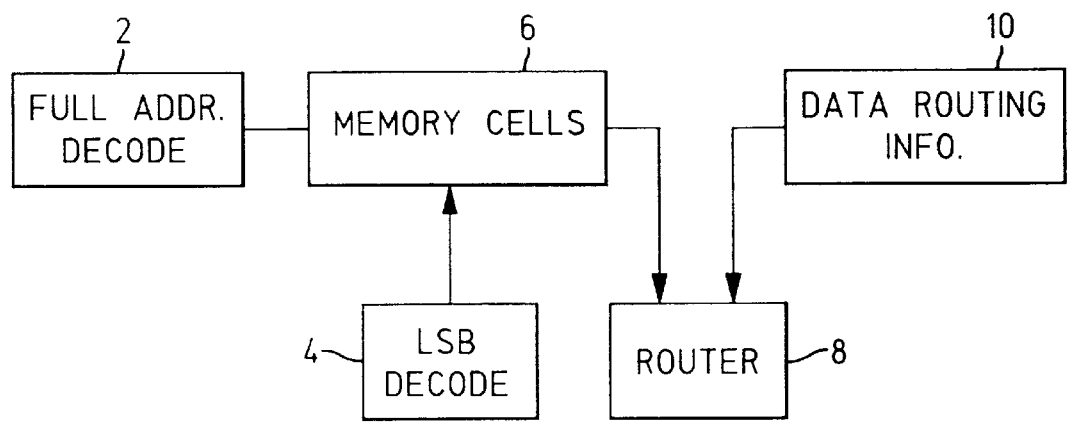
FIG. 2 shows a pictorial representation of part of a fault tolerant memory.

In FIG. 2 there are a number of blocks, representing the function of a fault tolerant memory made according to the present invention. When an entire row from a block in a plane is being substituted then the full row address 2 is decoded together with the N most significant bits of the column address, where N=log2 (the number of blocks in a column). The remaining bits in the column address (the least significant bits) 4 are decoded to address the memory cells 6. The output of the memory cells 6 is sent to a router 8 accompanied by data routing information 10 which informs the router of which data bits need to be replaced by the bits from the memory cells 6.

Figure 3:
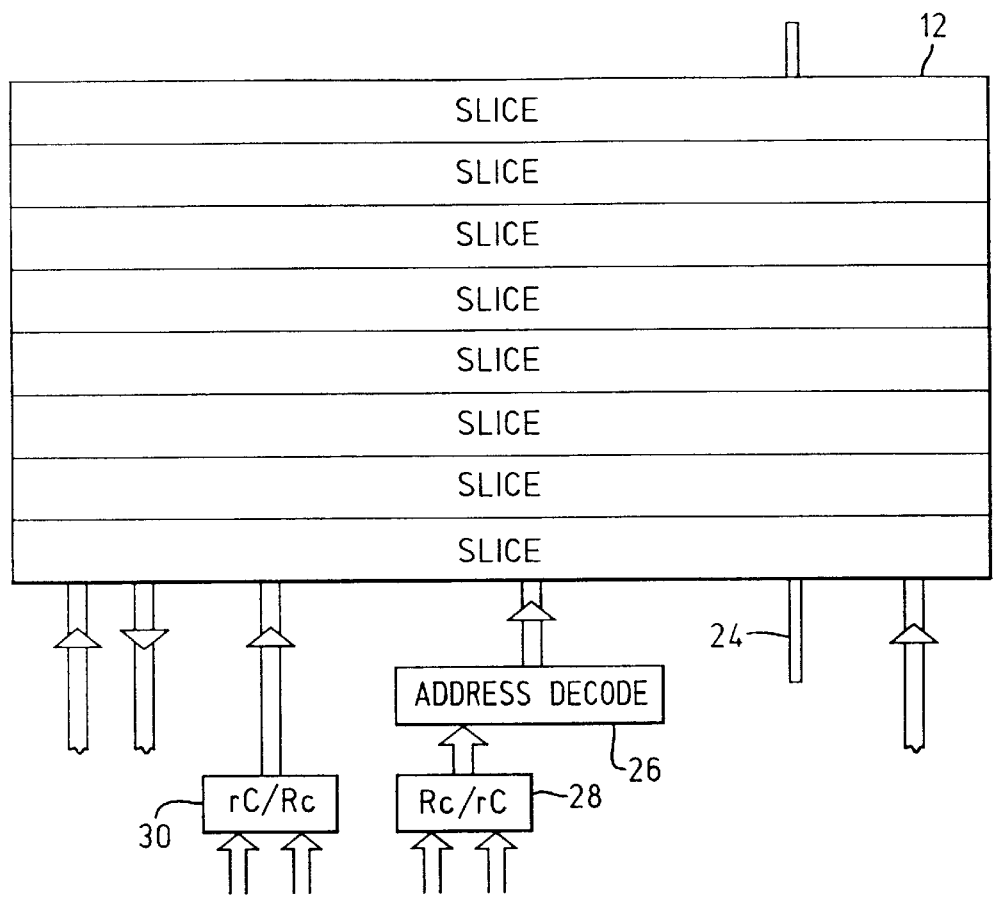
FIG. 3 shows a diagram of part of a fault tolerant memory.
Figure 4:
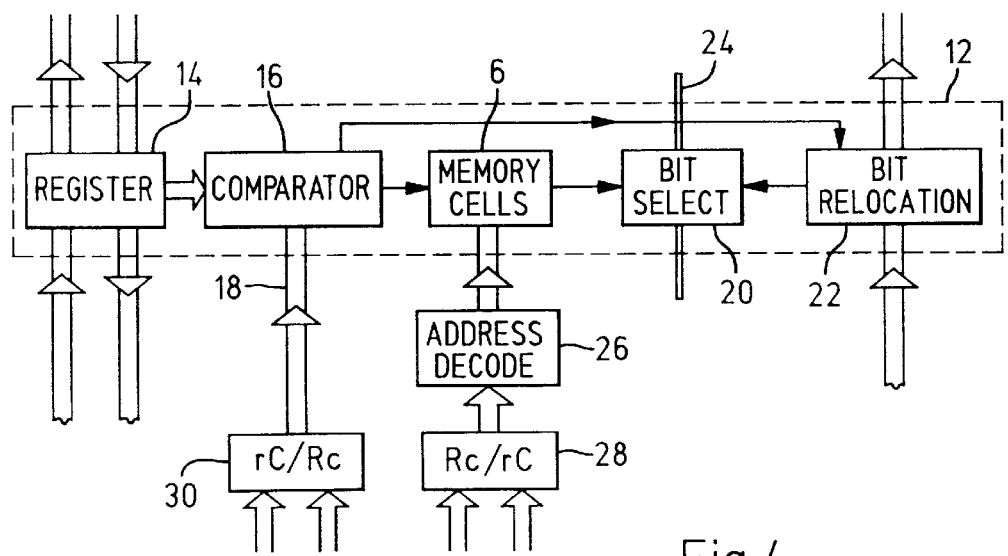
FIG. 4 shows a diagram of one slice from a fault tolerant memory.

In FIG. 3 there are a number of slices 12. Each slice 12 (as shown in more detail in FIG. 4) includes a register 14 to contain the address of a faulty memory location, a comparator 16 to compare the incoming address 18 with the address stored in the register 14, substitute memory cells 6 to replace defective bits from a main memory, a bit select register 20 to hold the substitute bits, a bit relocation register 22 to determine which particular bit (or bits) needs to be substituted, and a data bus 24 on which the substitute data is placed. The bit relocation register is essential because it ensures that the correct bit is replaced from the main memory. An address decoder 26 is used to decode a portion of the row or column address which is used to address main memory. There are also two registers 28 and 30 for holding the relevant portion of the row or column address.

One aspect of the present invention is the use of only a portion of the incoming address in the comparator circuitry. The incoming address is in the form of x bits for the row address and y bits for the column address, where x is typically twelve and y is typically twelve, although the invention is not restricted to these or similar numbers of address bits.

In other embodiments, individual bits may be replaced by means of the partial memory engine. Since most faulty memory circuits contain relatively few errors (compared with the total number of memory cells) it is unlikely in most cases that there will be other defective bits in the same row or column with the same bit sequence of three or four bits in the least significant portion of the address.

In a further embodiment, a memory system has the following characteristics. There is a ten bit row address, a ten bit column address, sixteen blocks in each plane (two rows of eight blocks) and a faulty row in one of the blocks. In this situation all ten bits in the row would be compared with the incoming row address but only the three most significant bits of the incoming column address would be compared with the corresponding three bits from the stored column address. The other (or at least some of the other) bits of the column address would be used to address the memory cells.

Provided there are not two defective bits in the row selected by the full address with errors at column addresses containing the same bit sequence over the three chosen bits, then the abbreviated column address will still uniquely access the defective location. It should be noted that if a row has more than one fault then the bits from the column address chosen for comparison must be different for all of the faults, otherwise the bit sequence would not uniquely address each fault.

The present arrangement is very flexible because the bits chosen for each defective location can be different for each slice. If there were a column error in one of the blocks then it would be preferable to use the full column address and a curtailed row address rather than the fill row address and a curtailed column address. With certain embodiments both of these options (full row—partial column, and partial row—fill column) may advantageously be used. It should be emphasised that each slice is separately configurable. This means that one slice might compare the full row address and the three least significant bits of the column address, the next slice might compare the full column address and the three least significant bits of the row address. It is not essential to the operation of the invention that three bits are used. In some embodiments more bits might be used, in others fewer bits might be used.

The configuration of the memory cells will depend on the type of replacement policy that is being implemented by the partial memory engine. In one of the above examples it was a block row or column replacement policy that was being implemented. Therefore, the memory cells used in the above embodiment would only have to be addressable in individual blocks. i.e. they would not have to be bit addressable. However, if a bit replacement system were being used in conjunction with a 1k by 1 memory, then the memory would have to be addressed by ten address bits (since $2^{10}$=1k) so that each location could be uniquely addressed. The ten bits would come from the least significant bits of either the row or column address, whichever was not being used as an input to the comparator. The least significant address bits are used to ensure that there is a continuous range of addresses. This is essential to be able to address each location in the memory cell array.

It will be appreciated that various modifications may be made to the above described embodiments within the scope of the present invention.

I claim:
1. A memory device comprising:
a matrix array of memory cells arranged in rows and columns, each of said memory cells being uniquely addressable by a combination of a cell row address and a cell column address;
a plurality of memory blocks subdividing said matrix array, each of said plurality of memory blocks comprising a sub-array of said memory cells and being uniquely addressable by a combination of a block row address and a block column address, said block row address consisting of a first plurality of most significant bits of the row address of the memory cells contained within said block, and said block column address consisting of a second plurality of most significant bits of the column address of the memory cells contained within said block;
storage means adapted to store addresses of faulty memory cells in said matrix array;
an addressable substitute memory comprising substitute memory cells for substituting for said faulty memory cells; and
comparator means responsive to a selected one of a first combination of a block row address and a cell column address only and a second combination of a cell row address and a block column address only, to select a faulty memory cell from the memory array for substitution by a memory cell from said substitute memory.

2. A memory device according to claim 1, wherein said matrix array of memory cells is provided in a discrete chip which is coupled to an off-chip device that includes said storage means, said substitute memory, and said comparator means.

3. A memory device according to claim 1, wherein said selected memory cell from said substitute memory is selected by an address comprising a part of the address of the corresponding faulty memory cell.

4. A memory device according to claim 3, wherein said memory cell from said substitute memory is selected by a substitute row address and a substitute column address and at least one of said substitute row address and said substitute column address comprises a plurality of least significant bits of the address of said faulty memory cell.

* * * * *